United States Patent [19]
Ross et al.

[11] B 3,986,131
[45] Oct. 12, 1976

[54] CLASS AB-DUAL PUSH-PULL AMPLIFIER

[75] Inventors: David Gene Ross, Red Bank; Paul Schnitzler, Kendall Park, both of N.J.

[73] Assignee: Bell Telephone Laboratories, Incorporated, Murray Hill, N.J.

[22] Filed: Dec. 9, 1974

[21] Appl. No.: 530,813

[44] Published under the second Trial Voluntary Protest Program on February 17, 1976 as document No. B 530,813.

[52] U.S. Cl. .................................. 330/15; 330/40
[51] Int. Cl.² .................................................. H03F 3/26
[58] Field of Search ............. 330/15, 207 A, 22, 40

[56] References Cited
UNITED STATES PATENTS

| | | |
|---|---|---|
| 3,239,772 | 3/1966 | Dennis .............................. 330/15 X |
| 3,421,099 | 1/1969 | O'Malley ............................. 330/15 |
| 3,676,613 | 7/1972 | Brewer .......................... 179/170 T |
| 3,806,862 | 4/1974 | Chao ................................ 330/15 X |

FOREIGN PATENTS OR APPLICATIONS

| | | |
|---|---|---|
| 1,178,897 | 10/1964 | Germany ........................... 330/118 |

*Primary Examiner*—James B. Mullins
*Attorney, Agent, or Firm*—John K. Mullarney; Joseph A. Cameron

[57] ABSTRACT

A push-pull transistor amplifier wherein the transistors are biased in the Class A region but near collector saturation. An inductance is series coupled with the collector source to permit the amplifier to handle large peak-factor signals. A diode is connected in parallel with the collector-base junction of each transistor to prevent charge storage effects.

9 Claims, 9 Drawing Figures

CLASS AB-DUAL PUSH-PULL AMPLIFIER

BACKGROUND OF THE INVENTION

The present invention relates to a linear, low voltage operation, push-pull amplifier for use in submarine cable systems.

In submarine cable systems, the power is supplied to the repeater-amplifiers from the shore stations, and dc repeater voltages are in series. For a long cable system with a multitude of repeater-amplifiers, it is essential that the dc voltage required by each repeater-amplifier be as small as possible in order to keep terminal dc voltages at levels that are compatible with reliable corona free performance.

It is accordingly a primary object of the invention to operate a repeater-amplifier with low supply voltage.

And a related object is to provide a push-pull amplifier circuit that operates with a lower supply voltage than the conventional Class A, Class B or Class AB push-pull amplifiers.

Since a multitude (e.g., 1500) of repeater-amplifiers are coupled in tandem in a submarine cable system, it is imperative that each amplifier be as linear as possible. The distortion (e.g., crossover distortion) created in any given amplifier will be exacerbated in those that follow.

It is a further object of the invention, therefore, to provide an amplifier circuit that has a high degree of linearity and is thus substantially free of distortion.

The patent to S. T. Brewer, U.S. Pat. No. 3,676,613, issued July 11, 1972, discloses a high efficiency, Class B, push-pull amplifier for use in submarine cable systems. Like Class B push-pull amplifiers in general, the amplifier of Brewer achieves a high degree of power efficiency, but this is obtained at a sacrifice in amplifier linearity. As pointed out by Brewer, linearity can be improved by utilizing feedforward techniques, but this introduces added circuit complexity and costs. Also, as with Class B push-pull amplifiers generally, the collector voltage provided by the voltage supply source must be of a magnitude at least as great as the peak of the largest signal to be handled. Yet, as previously pointed out, it is important in submarine cable systems that the voltage required by each repeater be as small as possible.

Accordingly, a further object of the invention is to provide a linear amplifier, for use in submarine cable systems, which requires low supply voltage and which utilizes simple and reliable components.

SUMMARY OF THE INVENTION

The Class AB-dual amplifier of the present invention is a push-pull amplifier wherein the transistors are biased in the Class A region but near collector saturation. The amplifier operates in Class A for small signals; for large signals, the two transistors are alternately active as in a conventional Class B amplifier, but in this dual version the inactive device is in saturation (as opposed to cut-off). An inductance is series coupled with the collector source so as to enable the amplifier to handle large peak-factor signals such as a multichannel load. A diode (e.g., a Schottky barrier diode) is respectively connected in parallel with the collector-base junction of each transistor to prevent the nonlinear distortion caused by base-region charge storage effects.

It is a feature of the invention that, unlike conventional Class A, B and AB push-pull amplifiers which are known to require relatively low load impedances at moderately high signal powers, the Class AB-dual amplifier has no such load impedance limitations and therefore is capable of much higher gain for a given signal power level.

BRIEF DESCRIPTION OF THE DRAWINGS

The invention will be more fully appreciated from the following detailed description when the same is considered in connection with the accompanying drawings, in which.

DETAILED DESCRIPTION

The class of a push-pull amplifier is determined by the fraction of the period of a sinusoid during which each device is active. In Class A, both transistors are always active; in Class B, each transistor is active in alternate half cycles; in Class C, each transistor is active for less than 180° in each cycle; Class AB amplifiers are Class A for small signals but are Class B for large signals. Class A, AB and B push-pull circuits are acceptable for linear amplification purposes, while Class C circuits are exclusively nonlinear and hence are of no interest to submarine cable systems.

While transistors in a Class A amplifier are biased in the active region, in conventional Class B amplifiers they are biased at or near cut-off. The amplifier of the invention is unique in that the transistors are biased at or near saturation. Thus, when a transistor is in its "off" or inactive state it is saturated and not cut-off.

Since a saturated transistor is like a short circuit and a transistor at cut-off is like an open circuit, the saturated "inactive" state of the present amplifier can be considered as a dual to the cut-off state in a conventional Class B circuit. This duality is also present in other respects. For example, when power supply energy storage is required, as in Brewer, a conventional Class B circuit will employ capacitor storage; the present amplifier utilizes an inductance for energy storage. The reader may infer other dualities in the following description. The terms "dual" and "duality" are commonly encountered in circuit design and network analysis and are suitable for the purpose of designating the present class of push-pull amplifiers. Because of the above recited duality, or complementarity, a push-pull amplifier in accordance with the invention is called a Class AB-dual.

Figure 1:
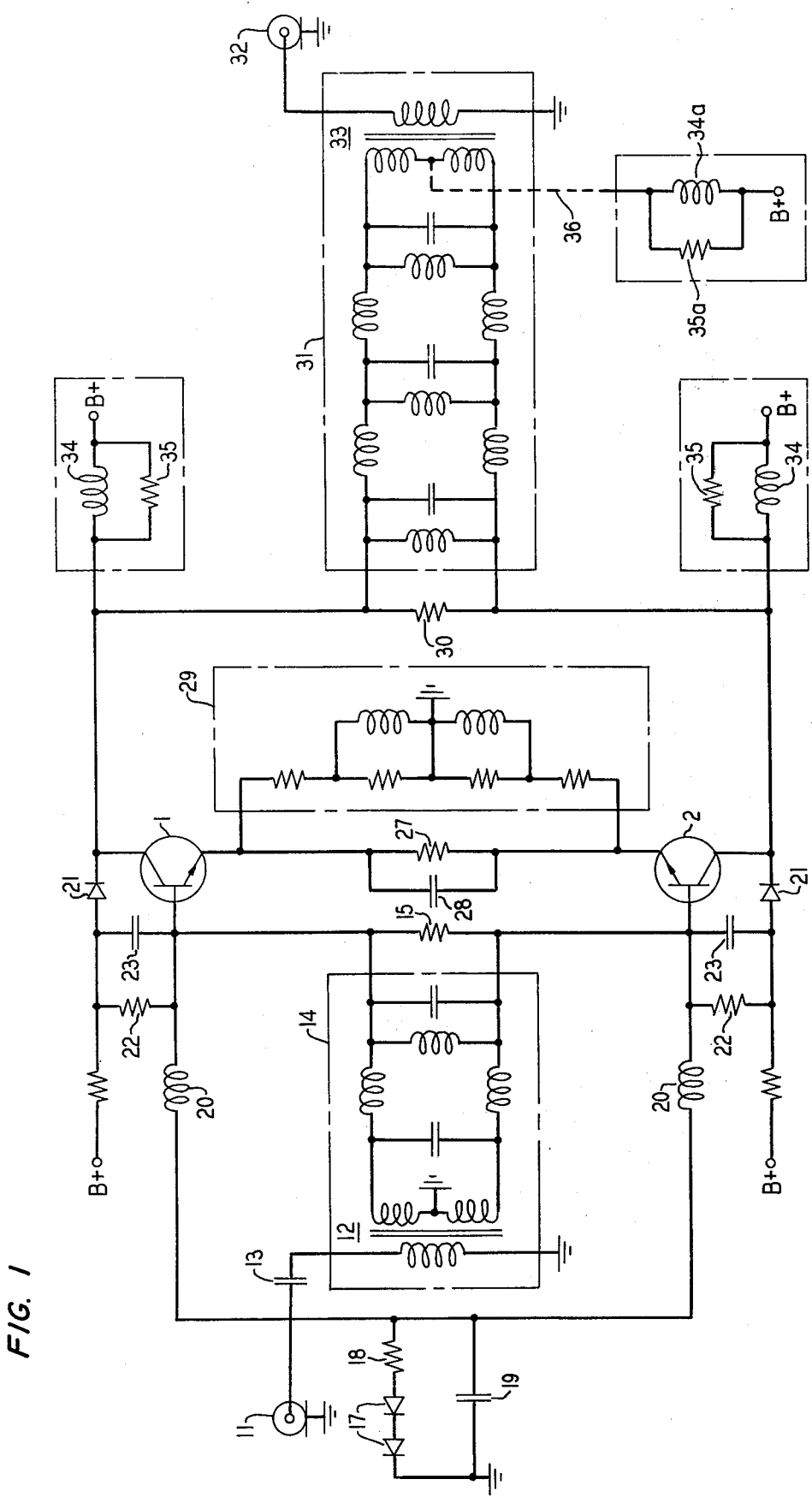
FIG. 1 is a schematic circuit diagram of a transistor amplifier in accordance with the present invention.

A Class AB-dual push-pull amplifier constructed in accordance with the invention is shown in FIG. 1. A wideband (e.g., 75 – 125 MHz) frequency division multiplexed (FDM) signal is coupled from the coaxial cable 11 to the transformer 12 via the coupling capacitor 13. The transformer 12 comprises part of a filter-type impedance transformation network 14 that serves to match the impedance of the line to the input transistor impedance over the band of interest. Such networks and the design of the same are well known to those in the art. The resistance 15 provides a brute force impedance termination, which matches the impedance of the network 14. The balanced output of network 14 is delivered to the bases of the n-p-n transistors 1 and 2. The base bias for transistors 1 and 2 is developed across the series circuit consisting of diodes 17 and resistance 18. An ac bypass capacitor 19 shunts the diode-resistance bias network. The inductances 20 serve to ac isolate the bases of the transistors from the bias network. A diode 21 is connected in parallel with the collector-base junction of each transistor for purposes to be described in detail hereinafter; each diode is poled in the same direction as the collector-base junction. The resistances 22 serve to establish the bias for the diodes 21, and each shuntconnected capacitance 23 provides an ac bypass over the frequency band of interest. Each diode is biased so as to turn on just at or immediately before collector saturation of the transistor. At all other times (i.e., during Class A operation) the diodes are in their inactive or off state. A small amount of degenerative feedback is provided by the parallel connected resistance 27 and capacitance 28. The resistance-inductance network 29 establishes the dc bias at the transistor emitters and it provides common mode stability. The network 29 is considered conventional in transistor circuit design. The resistance 30 constitutes the collector load across which the output signal ($E_o$) is developed. The filtertype impedance transformation network 31 matches the collector impedance to the impedance of the outgoing coaxial line 32, and coupling to the latter is via the transformer 33 which comprises part of the impedance matching network 31. The collector of each transistor is respectively connected to the voltage source (B+) via an inductance 34. The energy stored in each inductance is used to provide the requisite peak signal capacity, so that the circuit can accommodate large peak-factor signals such as a multichannel load. It can not, of course, sustain large signals for long periods of time, but this is of little consequence for submarine cable and similar applications wherein large peak-factor signals (e.g., FDM) are typically encountered. Each inductance 34 is shunted by a relatively large resistance 35 for stabilization purposes. Alternatively, a single inductance 34a may be used in place of the pair of inductors 34. This single inductance would be connected between the voltage source and the center tape of the primary of transformer 33, as indicated by the dotted line 36. The inductance 34a would function in the same fashion to the same end as inductances 34. Inductance 34a should, of course, also be shunted by a stabilizing resistance 35a. If circuit performance is the primary consideration, the use of separate inductors 34 in the respective collector paths is the preferable alternative; this approach keeps the dc current out of the transformer 33 and thus avoids possible dc saturation of the transformer core. The proposed use of inductance in the dc collector paths will be further discussed hereinafter.

Many aspects of the described circuit are considered to constitute straightforward circuit design (e.g., the networks 14, 29 and 31). The novel aspects of the circuit will now be covered in detail.

In accordance with the invention, the transistors 1 and 2 are biased in the Class A region but near collector saturation so that the amplifier operates in Class A for small signals, but for large signals the two transistors are alternately active, as in a conventional Class B push-pull amplifier. However, in this dual version the operation is unique in that the inactive device is at saturation (as opposed to cut-off for conventional Class B). More specifically, the transistors are biased near to saturation so that signals whose peaks are of the order of the RMS value (e.g., up to two times the RMS value) of the composite signal to be amplified are handled Class A, but signals of larger magnitude are handled in the Class B-dual mode.

Figure 2:
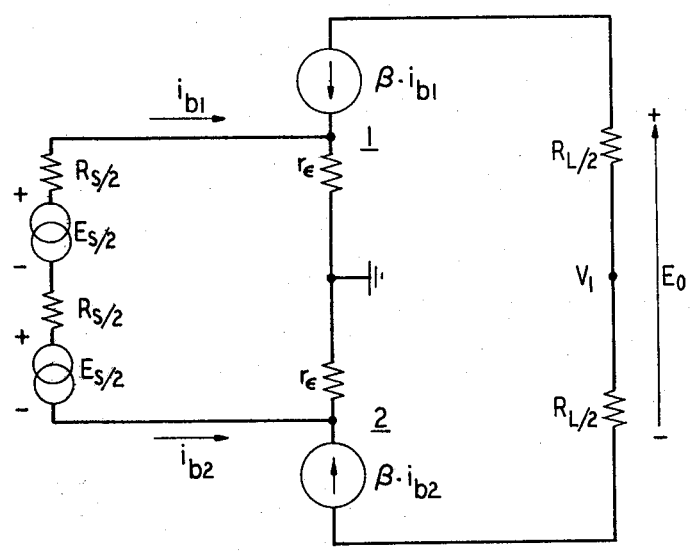
FIG. 2 is an ac equivalent of the circuit of FIG. 1.

FIG. 2 shows the ac equivalent of the circuit of FIG. 1, particularly for small signal, Class A operation. Now if we assume a large $\beta$ (current gain), the voltage gain is:

$$G_V = \frac{E_o}{E_s} = \frac{-\beta R_L}{R_s + 2(1+\beta)r\epsilon} \approx \frac{-R_L}{2r\epsilon}. \qquad (1)$$

As will be evident to those in the art, this is the gain of a Class A amplifier that has some emitter degeneration.

Figure 3:
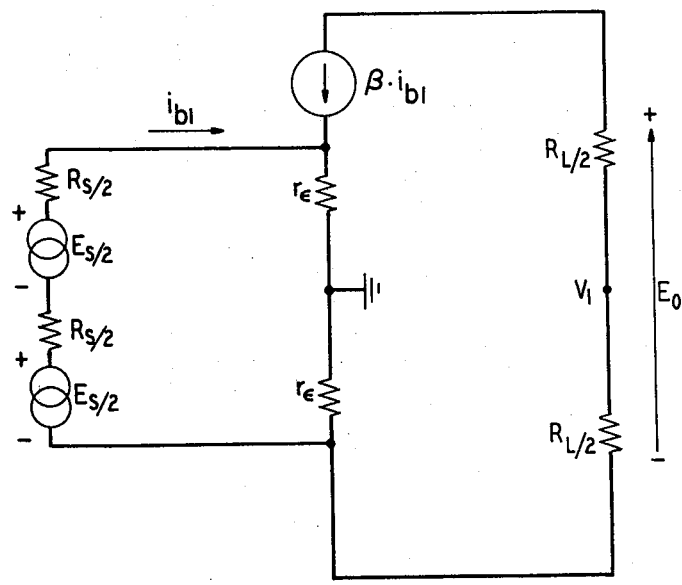
FIG. 3 is a modified ac equivalent of the circuit of FIG. 1.

Consider now, the case where during part of a cycle one transistor saturates, e.g., transistor 2. For present purposes, this is equivalent to short circuiting $\beta i_{b2}$. FIG. 3 shows the modified ac equivalent for this circuit condition. The current flowing in the two $r$ 's will be $i_{b1}+\beta i_{b1}$ and the sum of voltages around the input loop is:

$$E_s = R_s \cdot i_{b1} + (i_{b1}+\beta i_{b1})2r\epsilon \qquad (2)$$

The output voltage $E_o = -\beta i_b R_L$. Combining this with the expression for $E_s$ gives:

$$E_o = -\beta R_L E_s/(R_s+(1+\beta)2r\epsilon) \qquad (3)$$

and the gain is:

$$G_r = \frac{E_o}{E_s} = \frac{-\beta R_L}{R_s + 2(1+\beta)r\epsilon} \approx \frac{-R_L}{2r\epsilon}. \qquad (4)$$

This is identical with the Class A case, Equation (1). Thus, to a close approximation, we have the desired result of no change in gain going from Class A to Class AB-dual. And implicit in this result is, of course, good amplifier linearity and its concomitant of low distortion operation. Experimentation has verified these conclusions. The symbols and terms used in the above equations, and in FIGS. 2 and 3, are commonly encountered in transistor circuit design and analysis and hence definitions of the same herein would not appear to be necessary.

Normally for a Class B-dual mode of operation a constant current source would be required. However, in certain cases, it is known a priori that the amplifier will be called on to provide large signal operation only occasionally and for short durations, e.g., in wideband FDM carrier systems. In such cases, an alternative to the constant current source is possible.

Figure 4:
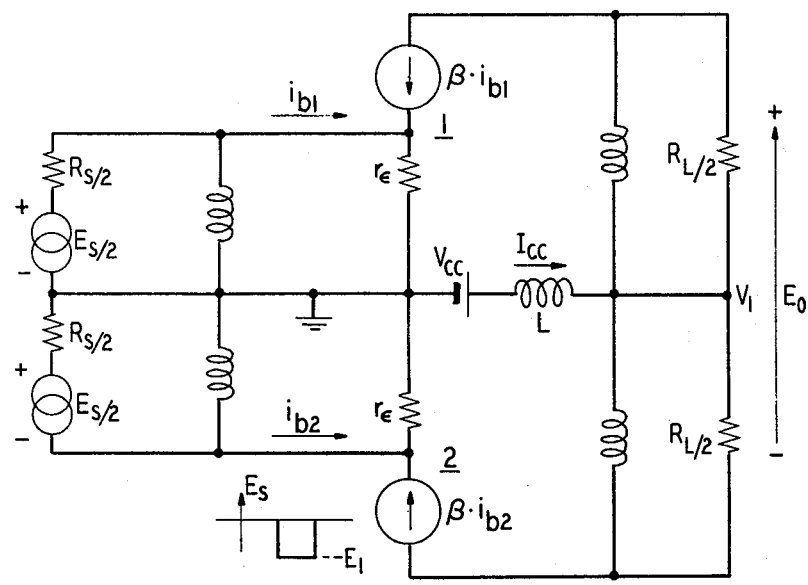
FIG. 4 is a further ac equivalent circuit which is useful in the explanation of the invention.

As will be recalled, the dynamic behavior of an inductance (L) is to resist a change in the current through it. How well this is done is dependent on the time constant, L/R, where R is the effective resistance in series with the inductance. For times that are short compared with this time constant, the current in the circuit changes very little. Therefore, an effective constant current source can be realized herein by a voltage source in series with an inductance. The voltage to be provided is that dc voltage, $V_{cc}$, that is necessary at $V_1$ to establish the required small signal capability (Class A operation). The steady state effective resistance is $V_{cc}/I_{cc}$ and the time constant is $t_L = L(I_{cc}/V_{cc})$, where $V_{cc}$ is the power supply voltage, $I_{cc}$ is the total collector current and, for the preferred embodiment, the L represents the composite inductance of the inductors 34 in parallel. The equivalent circuit of FIG. 4 corresponds to that of FIG. 2, but it further includes the source $V_{cc}$, the inductance L, and the input and output transformers.

Now assume that the signal source produces a negative pulse whose amplitude ($E_1$) is sufficient to saturate transistor 2. This is equivalent to short circuiting $\beta i_{b2}$ in FIG. 4. Initially ($t=t_o$), $E_o \approx -R_L E_s/2r\hat{\epsilon} = R_L E_1/2r\hat{\epsilon}$ where $-E_1$ is the amplitude of the input pulse. Now $E_o$ must be greater than $2V_{cc}$ or transistor 2 would not have saturated; therefore, $V_1 > V_{cc}$ and the current in L will start to change. This change will occur in accordance with the time constant given above: $L(I_{cc}/V_{cc})$, and acts to exponentially decrease $I_{cc}$. However, as the current in L decreases there is no change in the $\beta i_{b1}$ current so the change in $I_{cc}$ is carried symmetrically in the output transformer and no spurious output voltage results. This is independent of the signal frequency and, in particular, has no effect on the low frequency performance of the circuit.

The output voltage capability is limited only by the linearity of the inductance which, by appropriate design, can be very good. Thus the peak voltage capability becomes practically independent of the power supply voltage. For this reason, the amplifier circuit of the invention can operate with a lower supply voltage than the conventional Class A, Class B or Class AB push-pull amplifier.

For satisfactory performance, the time constant ($t_L$) should be long (e.g., ten times) relative to the period of the lowest frequency of interest.

A significant aspect of the present type of amplifier is that the transistors can be expected to go to saturation at times during normal operation. A saturated transistor stores charge in its base region which then acts to delay recovery into the active state. This delay is a nonlinear effect in that it is dependent on the amplitude of the signal causing saturation. Also, it has a hysteresis effect: there is delay coming out of saturation but not entering. Alone, this effect would cause some signal distortion at high frequencies but when the inductive aided power supply is used the problems are greatly increased. One manifestation is that a peculiar "echo"-like output is observed in response to an input pulse.

Figure 5A:
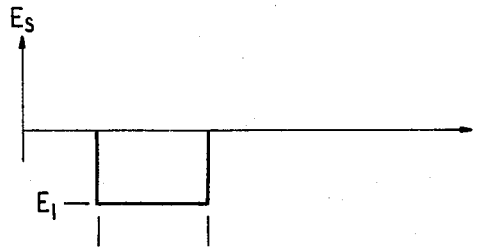
FIGS. 5A – 5C show voltage waveforms which illustrate, in part, the charge storage problem dealt with in accordance with a feature of the invention.
Figure 5B:
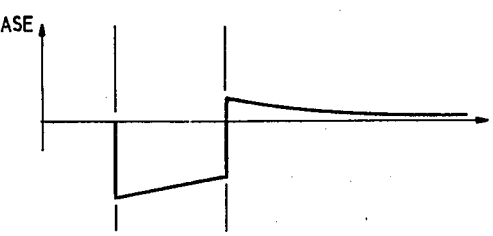

The explanation of this echo will now be provided to illuminate the charge storage problem. In the foregoing description, it was pointed out that the current decreases in the inductor when a transistor goes to saturation. In addition, due to the low frequency response of the input transformer, the amplitude of the base-to-base voltage decreases with time. Thus, at the end of the pulse, $t=t_1$, when the positive transition (of $E_s$) occurs, there is a positive overshoot (FIGS. 5A and B). This can be large enough to saturate transistor 1. However, due to charge storage, transistor 2 is still saturated. Therefore, both transistors are temporarily saturated and the load then appears in parallel with the input, making $E_o = V_{base-to-base}$. This forces $V_1$ to drop to near zero and $-V_{cc}$ appears across L. The current $I_{cc}$ increases and produces equal and opposite voltages across the two $r\hat{\epsilon}$'s. These voltages have polarities that serve to aid in the recovery from saturation of both transistors.

Figure 5C:
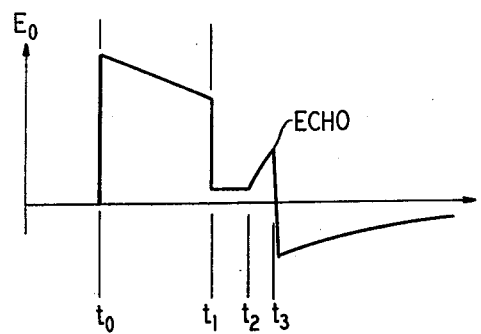

Since transistor 1 received a much smaller saturation-inducing signal than did transistor 2 (recall that this signal was just due to the overshoot), transistor 1 recovers first which allows its collector to swing positively, $t=t_2$. This has the same polarity as the original desired output signal (it looks like an echo). Shortly thereafter, transistor 2 recovers and both devices become active; at this point linear operation is restored and $E_o$ swings negative to properly reflect the input overshoot, $t=t_3$ (FIG. 5C). Both devices are now active and Class A operation obtains. This echo effect was first intimated during a computer simulation of the circuit and it has since been verified experimentally. The effect of charge storage on a sinusoidal signal is much less dramatic; it is important, however, because it causes nonlinear distortion.

In order to reduce or substantially eliminate charge storage it is necessary to limit or even prevent the saturation of the transistors' collector-base junction. This can be done by a diode which is connected in parallel with the collector-base junction and poled in the same direction. This diode, which is normally reverse-biased, should be biased so as to turn on just at or immediately before the collector-base junction saturates. Also, the diode should have a very short turn off or recovery time.

A Schottky barrier diode has a virtually zero minority carrier lifetime so that its recovery time is determined by a simple capacitor discharge. This will be very fast since its junction capacitance is small. Other diodes (e.g., PIN) are known to have sufficiently small minority carrier lifetimes and can be advantageously utilized in the circuit of the invention. The turn on voltage for each diode 21 is set by each resistance 22, while each capacitance 23 keeps the ac impedance in series with the diode as small as possible.

There are, of course, applications where the transistors are capable of operating at frequencies substantially higher than the signal(s) to be amplified. In these cases, the charge storage effect of the transistor is sufficiently small so that the diodes may be dispensed with.

Figure 6A:
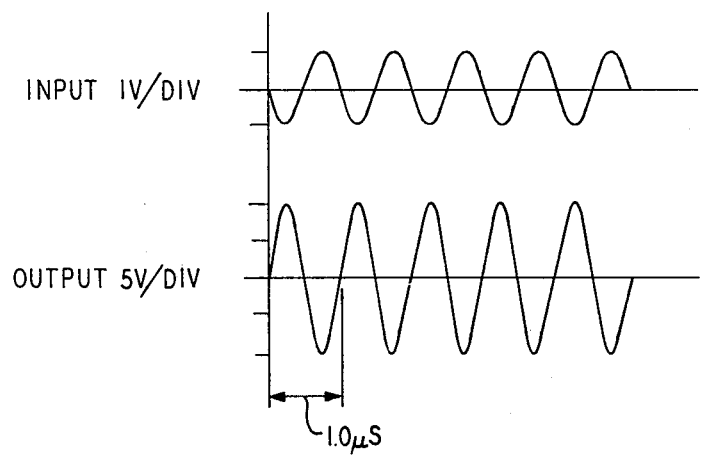
FIGS. 6A and 6B illustrate the large signal behavior of the circuit of the invention.
Figure 6B:
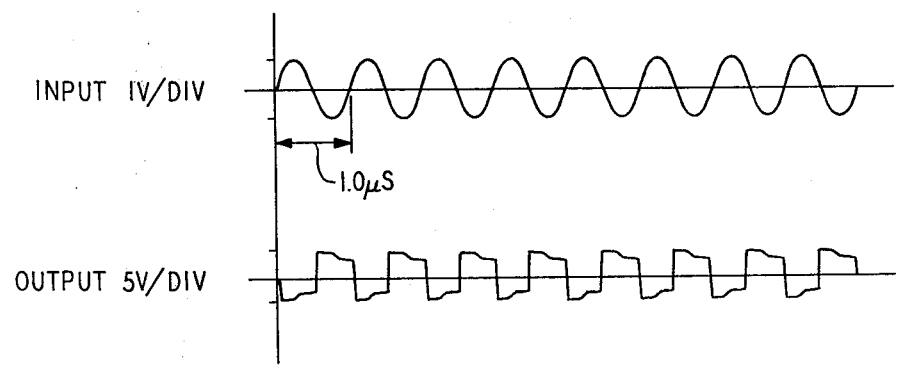

FIGS. 6A and 6B illustrate the large signal performance of the circuit of the invention. FIG. 6A shows the amplifiers's output in response to a tone burst and FIG. 6B shows the output in response to a continuous tone at 1 MHz. With $V_{cc}$ (effective) = 2.5v, Class A operation would permit a peak-to-peak signal of 4 $V_{cc}$ = 10v. However, since there is a 2:1 stepdown transformer, this would be 5v peak-to-peak at the output for conventional Class A operation. In contrast, for the Class AB-dual circuit with the same $V_{cc}$, during a burst of 5 cycles, a 20v peak-to-peak sine wave output is achieved (FIG. 6A).

Inasmuch as the power supply inductance cannot maintain a constant current indefinitely, a continuous signal must be limited by Class A boundaries. As shown in FIG. 6B, hard limiting occurs at a peak-to-peak output of 5v, as expected, when the input signal is continuous.

The noted advantages of the Class AB-dual amplifier, just described, can also be realized in a Class B-dual circuit in accordance with the invention; the argument of Equations (2) through (4) above are equally applicable thereto. For Class B-dual operation, the transistors are biased just at saturation. A Class B-dual circuit requires a constant current source, which rules it out for submarine cable purposes. It is to be understood, however, that applicants' invention is in no way limited to this particular use and the same may find application in other and different systems (e.g., a CATV system).

The transistor type shown in FIG. 1 is merely by way of illustration, it being clear to those in the art that p-n-p transistors can generally be substituted for n-p-n transistors and vice versa with due regard, of course, to the polarities of the direct current potential source and of the diodes. For example, with p-n-p transistors the diodes 21 would be poled in a direction opposite that shown in FIG. 1. Accordingly, it is to be understood that the foregoing disclosure relates to only a particular embodiment of the invention and that numerous modifications or alterations may be made therein without departing from the spirit and scope of the invention.

What is claimed is:

1. A linear amplifier comprising a pair of transistors each having an emitter, a collector and a base electrode, means for connecting the transistors in push-pull configuration, means for biasing the transistors at or near collector saturation, and means for providing a constant current source for at least short durations.

2. An amplifier as defined in claim 1 wherein the last recited means comprises inductance coupled into each collector path to store energy to provide a peak signal capacity for short durations.

3. An amplifier comprising a pair of transistors of similar conductivity type each having an emitter, a collector and a base electrode, means for connecting the transistors in push-pull configuration, means for biasing the transistors in the Class A region and near collector saturation, inductance means coupled in each collector path to provide a peak signal capacity for short durations, and diode means coupled in parallel with the collector-base junction of each transistor to substantially eliminate charge storage effects.

4. An amplifier as defined in claim 3 wherein small signals are amplified in the Class A mode, and large signals are amplified in a Class B-dual mode.

5. An amplifier as defined in claim 4 wherein said transistors are biased near to saturation so that signal peaks that are no more than twice the RMS value of the signal to be amplified are handled Class A and signals of greater magnitude are handled in the Class B-dual mode.

6. An amplifier as defined in claim 3 wherein said diode means comprises a pair of diodes each of which is respectively coupled in parallel with the collector-base junction of one of said transistors, said diodes being biased to turn on just at or immediately before the collector-base junction saturates.

7. An amplifier as defined in claim 6 wherein said diodes are of the Schottky barrier type.

8. An amplifier as defined in claim 3 wherein said inductance means comprises a pair of inductors each of which is respectively coupled between the collector voltage source and the collector of one of said transistors.

9. An amplifier as defined in claim 8 wherein the time constant presented by each inductor and the circuit resistance in series therewith is substantially larger than the period of the lowest frequency of interest.

* * * * *